United States Patent [19]

Takamine et al.

[11] Patent Number: 5,051,941
[45] Date of Patent: Sep. 24, 1991

[54] METHOD AND APPARATUS FOR LOGICAL SIMULATION

[75] Inventors: Yoshio Takamine, Kokubunji; Shunsuke Miyamoto; Takayuki Nakagawa, both of Tokyo; Yoshiharu Kazama; Yoshiaki Kinoshita, both of Hadano, all of Japan

[73] Assignee: Hitachi, Ltd., Tokyo, Japan

[21] Appl. No.: 478,511

[22] Filed: Feb. 12, 1990

Related U.S. Application Data

[63] Continuation of Ser. No. 101,023, Sep. 25, 1987, abandoned.

[30] Foreign Application Priority Data

Sep. 26, 1986 [JP] Japan .................. 61-225937

[51] Int. Cl.⁵ .................. G06F 15/20; G06F 9/44
[52] U.S. Cl. ................. 364/578; 364/200; 364/221.2; 364/264.3
[58] Field of Search ........... 364/200, 900, 578

[56] References Cited

U.S. PATENT DOCUMENTS

| | | | |
|---|---|---|---|
| 4,342,093 | 7/1982 | Miyoshi | 364/578 |
| 4,587,625 | 5/1986 | Marino, Jr. et al. | 364/578 |
| 4,635,218 | 1/1987 | Widdoes, Jr. | 364/578 |
| 4,694,411 | 9/1987 | Burrows | 364/578 |
| 4,725,971 | 2/1988 | Doshi et al. | 364/578 |

Primary Examiner—Felix D. Gruber
Attorney, Agent, or Firm—Antonelli, Terry, Stout & Kraus

[57] ABSTRACT

A method of logic simulation for simulating operation of a logic circuit by using basic signal values corresponding to states of output signals of elements of the logic circuit to be simulated and expanded signal values including the basic signal values. The logic circuit to be simulated is divided into a portion to be simulated by using the basic signal values and the expanded signal values and a portion to be simulated by using the basic signal values without using the expanded signal values. The elements for which definition of calculation method for output signal values for the input signal values including the expanded signal values is not easy are included in the latter portion, and other elements are included in the former portion. A virtual signal conversion element for converting the expanded signal into the basic signal is provided at a position where a signal is sent from the former portion to the latter portion so that the expanded signal value outputted from the element of the former portion is converted into the basic signal value before it is sent to the element of the latter portion.

14 Claims, 6 Drawing Sheets

| TYPE OF SIGNAL | WAVEFORM | EXPRESSION |
|---|---|---|
| '0' (LOW LEVEL) | TIME → | $(00000000)_2$ |
| '1' (HIGH LEVEL) | | $(00000011)_2$ |
| 'X' (UNDEFINED) | | $(00000010)_2$ |
| 'Z' (HIGH IMPEDANCE) | | $(00000001)_2$ |
| THOSE ARE NORMAL SIGNALS | | |
| 'Co' (POSITIVE PHASE 0 CLOCK SIGNAL) | | $(10000000)_2$ |
| '-Co' (NEGATIVE PHASE 0 CLOCK SIGNAL) | | $(11000000)_2$ |
| 'C1' (POSITIVE PHASE 1 CLOCK SIGNAL) | | $(10000001)_2$ |
| '-C1' (NEGATIVE PHASE 1 CLOCK SIGNAL) | PERIOD | $(11000001)_2$ PHASE NUMBER POLARITY FLAG CLOCK FLAG |

| INPUT SIGNAL VALUE \ CURRENT CLOCK | 'Cn' | '–Cn' |
|---|---|---|
| 'O' | 'O' | 'O' |
| 'I' | 'I' | 'I' |
| 'X' | 'X' | 'X' |
| 'Z' | 'Z' | 'Z' |
| 'Cn' | 'I' | 'O' |
| '–Cn' | 'O' | 'I' |
| 'Cp' | 'O' | 'O' |
| '–Cp' | 'I' | 'I' |

METHOD AND APPARATUS FOR LOGICAL SIMULATION

This is a continuation of application Ser. No. 101,023, filed Sept. 25, 1987 and now abandoned.

BACKGROUND OF THE INVENTION

The present invention relates to method and apparatus for logical simulation of an operation of a logic circuit, and more particularly to a logical simulation processor which simulates a logic operation of a large scale logic circuit at a high speed. The present invention relates to the, method of simulation disclosed in U.S. Pat. No. 4,899,273, entitled "Simulation Method and a Vector Processor Suitable Therefor" which is incorporated herein by reference. Use of a vector processor for high speed logic simulation of a large scale logic circuit is disclosed in Proceeding of ICCAD 1986, pages 390-393.

A method for introducing a new signal value for increasing the processing speed of logic simulation of a large scale logic circuit and improve the precision thereof has been known. For example, a clock event suppress system for increasing the processing speed by handling a periodically varying signal as a clock signal is disclosed in Proceeding of ICCD 1983, pages 277-280. A signal value is calculated only for an element in the logic circuit to be simulated in which a signal actually varies. In the logic simulation by an event driven algorithm, many signal value changes or events relating to the clock signal for controlling the operation of the logic circuit occur and such signals are represented by special signal values to reduce the quantity of logical simulation or the number of events in the event driven algorithm and increase the processing speed.

In the prior art, it is necessary to clearly define a relation between the signal value newly introduced and all elements of the logic circuit to be simulated, that is, a method for calculating an output signal value from an input signal value based on element functions of the elements in a signal system including the new signal value. The output signal value calculation process by the output signal value calculation method should not be too complex.

In the clock event suppress system, it is necessary to define the logical operation in the signal value system including the clock signal. In this case, logical AND and logical OR of the clock signal and a conventional "1" or "0" signal may be easily defined, but it is not easy to define a method for calculating the output signal value when clock signals are logically ANDed or ORed, or when the clock signal is applied to an element (delay element) which represents a delay by wiring.

For the logical OR or logical AND of the clock signal and the conventional "0" or "1" signal, the output signal value is "0" or equal to the value of the input clock signal, and the logical operation to calculate the output signal value can be readily defined. However, for the logical OR or logical AND of the clock signals, unlike the definition of the logical operation for calculating the output signal value in which conventional "0" or "1" logical signals are applied to a logical OR or logical AND element, it is not easy to define the logical operation in which input clock signals having their periods and phases are employed as input signal values, and an output clock signal value having its period and phase, which may be different from those of input clock signals, are calculated on the basis of the input clock signals. When the clock signal is applied to the delay element, it is necessary to calculate the phase of the clock signal in accordance with the period and phase of the input clock signal and a delay inherent to the delay element and produce the output clock signal having the calculated phase. Thus, an arithmetic operation for calculating the phase is required. Since the output signal appears delayed in the delay element even after a value of the input signal has been changed, it is necessary to hold the period of the output signal for each clock signal. Thus, the method for expressing the output value is complex and also the output signal value calculation method cannot be readily defined. Further, since the logical operation as well as the arithmetic operation are required in calculating the output value, means for attaining the output signal value is complex.

In the prior art, no attention has been paid for a case where the relation between the newly introduced signal value and the element of the logic circuit is not clearly defined or the output signal value calculation based on the above relation is not easily attained, and it is hardly applicable to general logic simulation.

SUMMARY OF THE INVENTION

It is an object of the present invention to provide method and apparatus for logic simulation which solve the problems encountered in the prior art and which easily attain the introduction of a new signal value to attain high speed logic simulation.

In accordance with the present invention, a logic circuit whose operation is to be logically simulated is simulated by using basic signal values including "0" and "1" corresponding to states of output signals of elements of the logic circuit and expanded signal values including the basic signal values, for example, a clock signal value which periodically changes between "0" and "1" as in the clock event suppress system. The logic circuit is divided into a circuit portion which is simulated by using the expanded new signal values and the basic signal values, and a circuit portion which is simulated by using only the basic signal values without using the expanded new signal values. The elements in which a calculation method for the output signal values when the expanded signal values are included in the input signal values or elements in which an output signal value calculation based on the above calculation method are included in the latter portion, and other elements are included in the former portion. A virtual conversion element for converting an input new signal value to an equivalent basic signal value and an input basic signal value to the same basic signal value as the input signal value is provided at an area which sends a signal from an element in the former portion to an element in the latter portion. The signal value from the element in the former portion is converted by the conversion element and the converted signal value is applied to the element in the latter portion as the input signal value. The portion which is simulated by using the new signal value can be simulated at a high speed, and the portion which is not easily simulated by using the new signal value is simulated by using the basic signal value while exchanging a signal mutually between the former portion and the latter portion, and while maintaining synchronization in the time matching in the simulation with the former portion which is simulated by using the new signal value, and the definition of the output value calculation method by using the new signal value is not necessary.

In accordance with the present invention, in the logic simulation of the logic circuit, the new signal value is not applied to the element which cannot readily attain the definition of the output signal calculation method when the signal value including the new signal value or the output signal value calculation based on the above calculation method while the new signal value is introduced and high speed simulation is done. Thus, the conventional simulation is effected and the introduction of the new signal value is readily attained.

In accordance with the present invention, when the new signal value system is to be introduced for increasing the logic simulation speed and improving the precision, the problem encountered partially in realizing it, that is, difficulty in calculating the output signal values by the new signal value system for certain elements is avoided and the intended object is achieved.

BRIEF DESCRIPTION OF THE DRAWINGS

These and other objects and advantages of the present invention will become apparent by reference to the following description and accompanying drawings, wherein.

DESCRIPTION OF THE PREFERRED EMBODIMENTS

Figure 1:
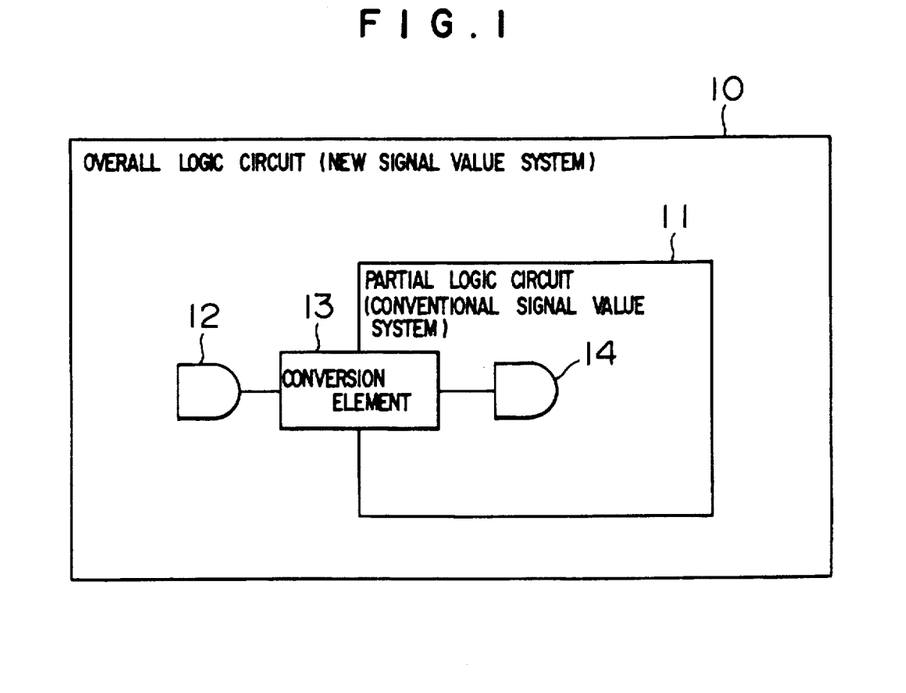
FIG. 1 shows an outline of the present invention.

Prior to the explanation of the embodiment of the present invention, an outline of the present invention is explained with reference to FIG. 1. In the present invention, as shown in FIG. 1, an overall logic circuit to be simulated is divided into a first portion which is to be simulated by using a new signal value system suitable for high speed logic simulation, including newly introduced signal values, and a second portion which is to be simulated by using a conventional signal value system, not including the newly introduced signal values. Those elements for which the relationship to the newly introduced signal values is not clearly defined or the output signal value calculation based on the above relationship is not easily attained are included in the second portion, and other elements are included in the first portion. When an output signal of an element 12 which belongs to the first portion is to be transmitted to an input signal of an element 14 which belongs to the second portion, a virtual conversion element 13 for logic simulation for converting the newly introduced signal value to a conventional signal value and passing an input conventional signal value as it is arranged between the elements 12 and 14. For the elements for which the logic simulation by the introduction of the new signal value is difficult, the logic simulation by using the conventional signal value is effected, and for other elements, the logic simulation by using the new signal value is effected so that the introduction of the signal values for increasing the logic simulation speed is attained.

One embodiment of the present invention is now explained with reference to the drawing. The present embodiment relates to a clock event suppress system.

A clock signal handled in the present embodiment is first explained with reference to FIG. 2.

Figure 2:
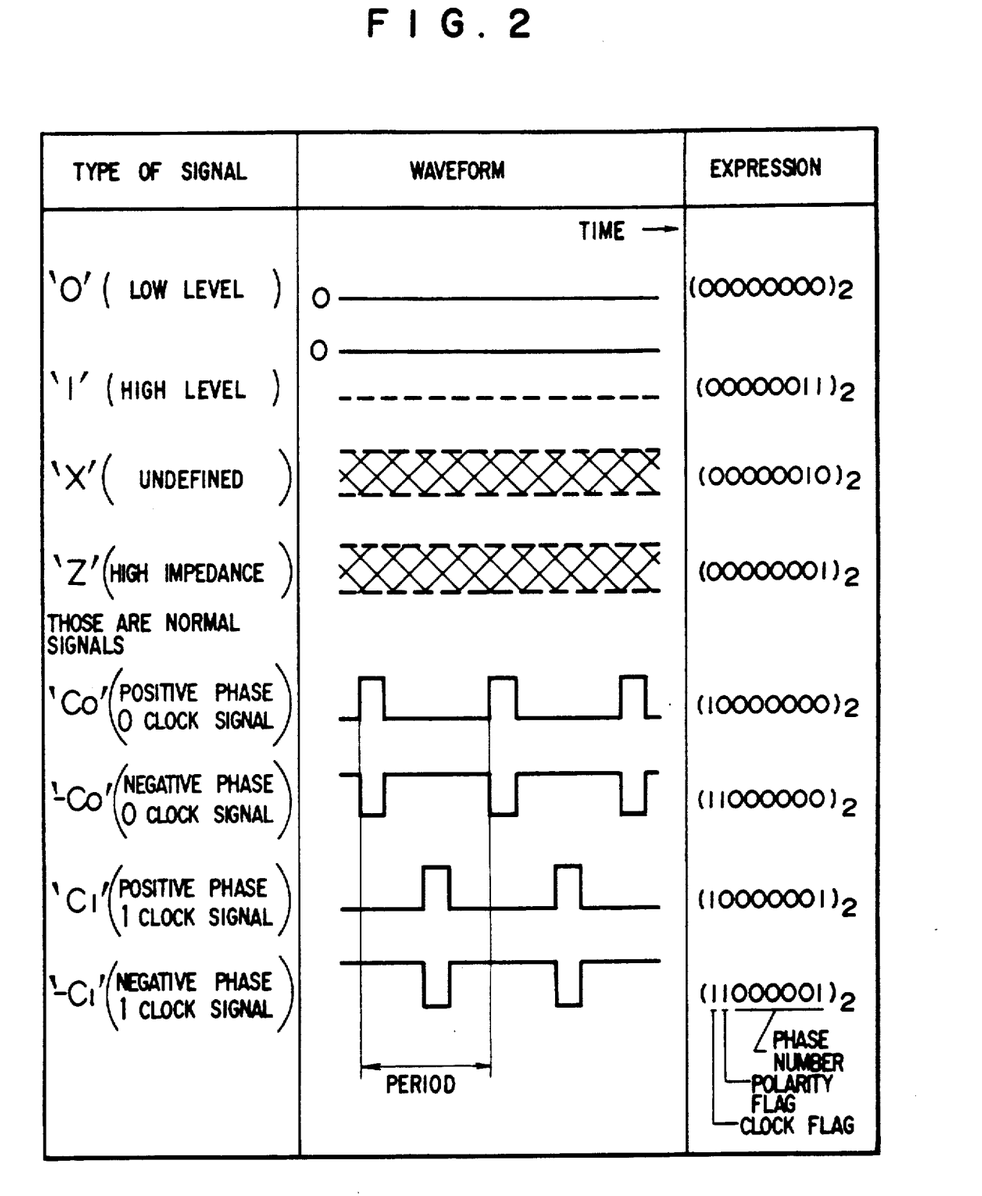
FIG. 2 shows types of signals to be handled in an embodiment of the present invention.

FIG. 2 shows types, waveforms and expressions of the signals handled in the present embodiment. The types of signals include conventional "0" (low level) signal, "1" (high level) signal, "X" (undefined or unknown) signal, "Z" (high impedance) signal, and "Co" (phase 0 clock signal) and "-Co" (negative phase 0 clock signal) which are inherent to the clock event suppress system. They have waveforms and are expressed as shown in FIG. 2. The 6 high order bits of the conventional signal are "0" and the 2 low order bits represent "0", "1", "X" or "Z". The one high order bit (clock flag) of the clock signal is "1" and the following one bit (polarity flag) is "1" negative, and the six low order bits represent the phase number. Thus, in the present expression, phases 0 clock signal to phase 63 clock signal can be represented. From a rise time of the clock signal waveform to the next rise time is defined as a clock signal period.

In the clock event suppress system, as shown in FIG. 2, a signal which actually varies periodically is handled as a constant clock signal in the simulation. Accordingly, no event occurs unless the clock signal changes to "0" or "1" signal or the period or phase of the clock changes.

Figure 3A:
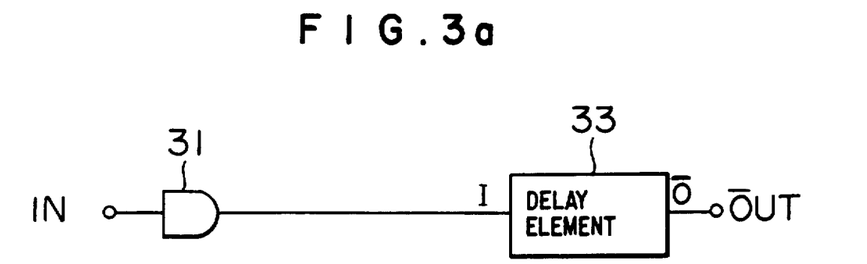
FIGS. 3a to 3d show embodiments of the present invention.
Figure 3B:
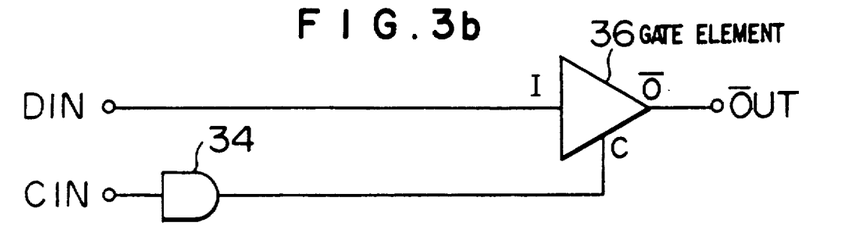

In the clock event suppress system, output signal value determination such as AND element or OR element is carried out by a logical operation including a clock signal. However, in elements shown in FIGS. 3a and 3b, the output signal value is not readily calculated. In a delay element 33 shown in FIG. 3a, when a clock signal is applied from a preceding stage element 31, it is necessary to determine the phase of the clock signal (phase number in the clock signal expression of FIG. 2) in accordance with the period and phase of the input clock signal and the delay inherent to the delay element 33 to produce the output signal. In this case, means for maintaining the period is required for each clock signal and the signal value expression method is complex. In order to determine the phase number, an arithmetic operation is used in addition to a conventional logical operation. As a result, the implementation means is complex. In a gate element 36 shown in FIG. 3b, when a clock signal is applied from a preceding stage element 34, the output signal periodically changes between "0" and "1" signal and "Z" (high impedance) signal. The clock signal shown in FIG. 2 periodically changes between "0" signal and "1" signal. If the periodically changing signal including "Z" signal or "X" signal is to be handled in the same manner as the clock signal, the signal value expression method is very complex and hard to attain. Accordingly, it is not realistic to handle the clock signal without limitation in the above delay element or gate element.

Figure 3C:
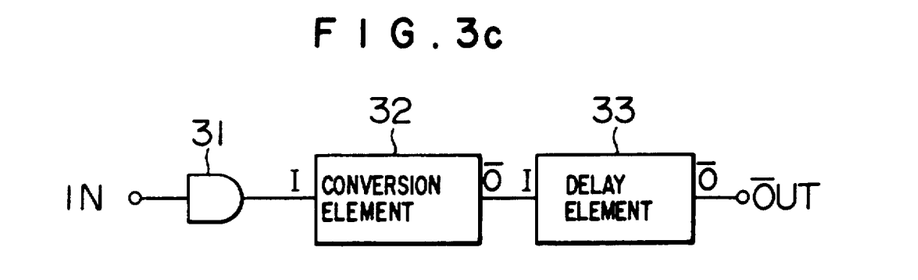
Figure 3D:
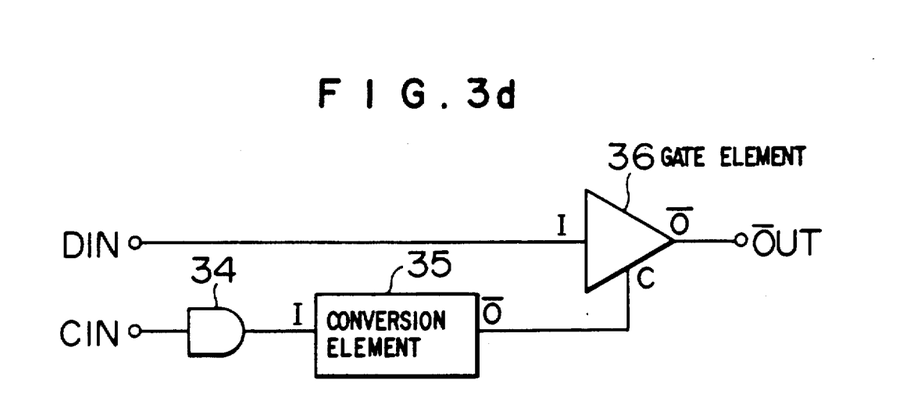

Thus, as shown in FIGS. 3c and 3d, virtual conversion element 32 or 35 for converting the clock signal to the normal "0" or "1" signal is provided.

Figure 4:
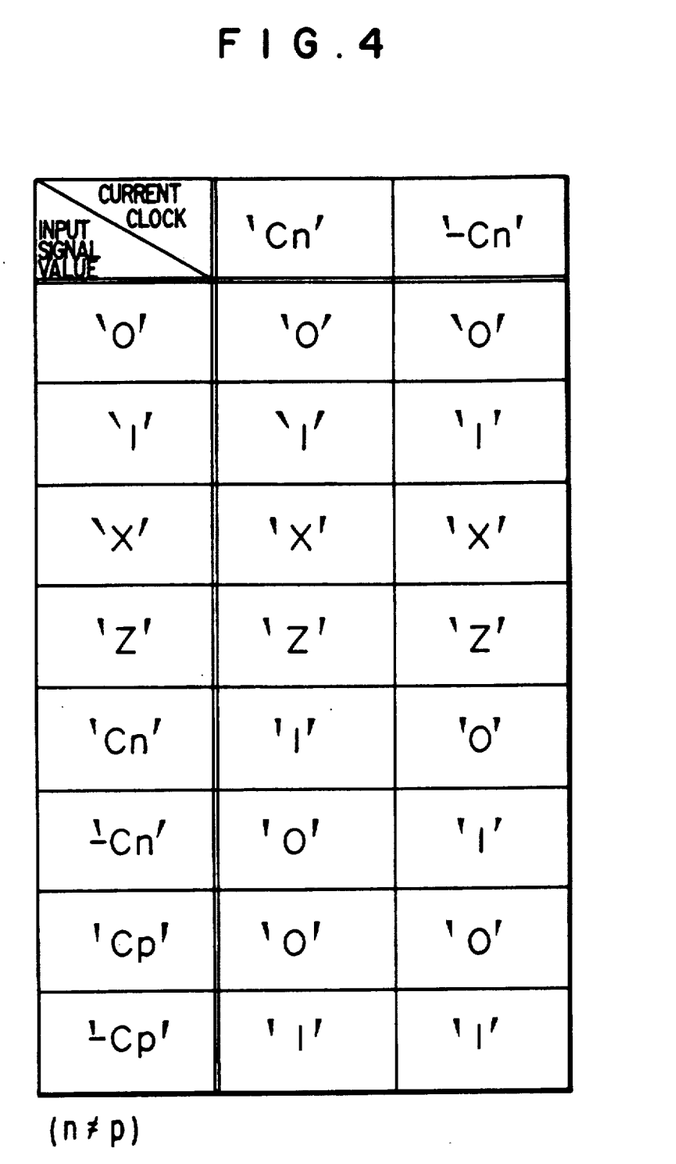
FIG. 4 shows an operation of a conversion element in the embodiment.

An operation of the virtual conversion element, that is, a relation between the input signal value and the output signal value is shown in FIG. 4, in which a current clock represents an actual state of a current clock signal, that is, phase number n of the clock signal which is in a rise state Cn or fall state -Cn. The current clock is updated as the simulation proceeds. As shown, when the normal "0", "1", "X" or "Z" signal is applied, the virtual conversion element outputs it as it is. On the other hand, when the clock signal is applied, the phase number is compared with that of the current clock and "0" or "1" is produced. For example, when the clock signal having the same phase number as that of the current clock is applied when the current clock is Cn, "1" is produced, and when the clock signal having a different phase number than that of the current clock is applied, "0" is produced. The conversion element converts the clock signal value to an equivalent normal signal value, and when the normal signal is applied, the conversion element outputs a signal value having the same value as the input signal value.

By inserting the virtual conversion element, it becomes possible to prevent the application of the clock signal to the output control pin C of the delay element 33 or gate element 36 in FIG. 3c and 3d.

A configuration of the logic simulation processor of the present invention is explained with reference to FIG. 5.

The present embodiment comprises a memory unit 40, an instruction control unit 41, an access control unit 42, an operation unit 43 and a register unit 44.

The memory unit 40 includes a program storage area 401 and a data storage area 402. The program storage area 401 contains a program for controlling the logic simulation of the present invention. The data storage area 402 contains all data necessary for executing the logic simulation including a table which translates the logic circuit to be simulated to a form suitable for the execution of the logic simulation.

The instruction control unit 41 serially fetches instructions of the program from the program storage area 401, decodes them and sends an instruction execution command to the access control unit 42, operation unit 43 and register unit 44.

The access control unit 42 comprises a load processor 421 and a store processor 422. The load processor 421 reads data from the data storage area 402 in accordance with the command from the instruction control unit 41 and sends it to the register unit 44. The store processor 422 writes the data sent from the register unit 44 into the data storage area 402 in accordance with the command from the instruction control unit 41.

The operation unit 43 includes an operation circuit 431 which carries out arithmetic operation and logic operation for the data sent from the register unit 44 in accordance with the command from the instruction control unit 41 and sends a result back to the register unit 44.

The register unit 44 temporarily stores the input data to the operation unit 43 or the result.

The construction of the logical simulation processor of the present embodiment has thus been explained.

The data necessary for the execution of the logical simulation in the logic simulation processor of the present embodiment is explained. The data is stored in the data storage area 402 of the memory unit 40 shown in FIG. 5.

Figure 6:
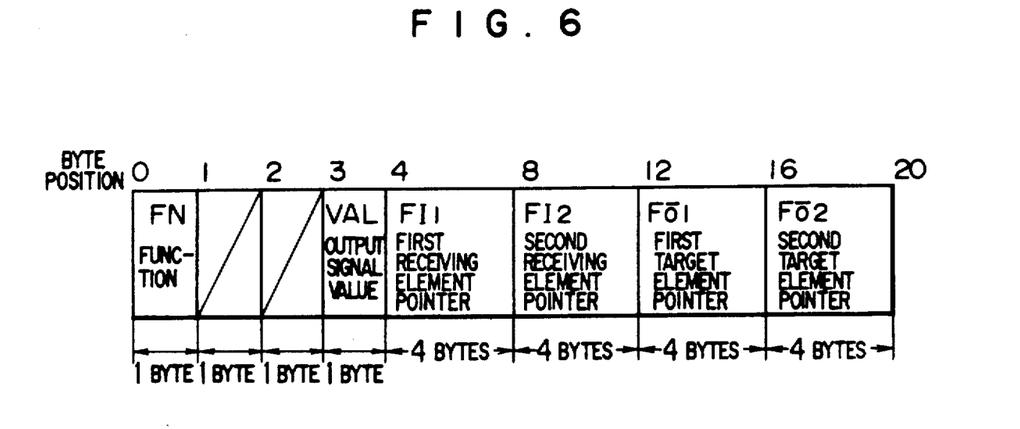
FIG. 6 shows a format of a logic table.

FIG. 6 shows a format of one record of a logic table which is a translation of a logic circuit to be simulated and is suitable for the execution of the logic simulation. One record of logic table represents one of gates, including AND and OR of the logic circuit, one of latches or one of virtual conversion elements which are features of the present invention. The record has 20-byte length and is divided into eight fields each having one or four-byte length. A one-byte field FN at the byte position 0 retains the function of the element corresponding to the record, that is, AND, OR, latch or virtual conversion element. A one-byte field at the byte position 1 and a one-byte field at the byte position 2 are not used in the present embodiment. A one-byte field VAL at the byte position 3 retains the output signal value of the element corresponding to the record. The output signal value is expressed as shown in FIG. 2. Four-byte fields FI1 and FI2 at the byte positions 4 and 8 retain pointers which point to records corresponding to the receiving elements, of the element corresponding to the record. Four-byte field FO1 and FO2 at the byte positions 12 and 16 retains pointers which point to records corresponding to target elements, of the elements corresponding to the record. Connection of the elements of the logic circuit to be simulated is represented by the pointer information retained in the fields FI1, FI2, FO1 and FO2.

In addition to the logic table, an event table and a conversion event table which is unique to the present invention are necessary for the execution of the logic simulation. The event table retains the pointer to point to the record to be next processed, as an event, due to a change of the input signal value for each record of the logic table. The conversion event table retains, as an event, the pointer to point to the record to be processed at the rise or fall of the clock because the input signal is a clock signal, in each record of the logic table whose field FN represents the virtual conversion element.

For the conversion element, the logic circuit is divided into a portion which is to be simulated by using the clock signal and a portion which is to be simulated without using the clock signal, and a pointer which points to a record corresponding to a receiving element and a pointer which points to a record corresponding to a target element are defined so that the conversion unit is inserted in a signal path from the element of the former portion to the element of the latter portion.

A field for retaining the number of retaining events is required for each of the event table and the conversion event table. A current clock retain field, a field for retaining the number of simulation execution cycle and a field for retaining the number of simulation and cycle which is specified as a parameter at the beginning of simulation execution are also required.

Figure 5:
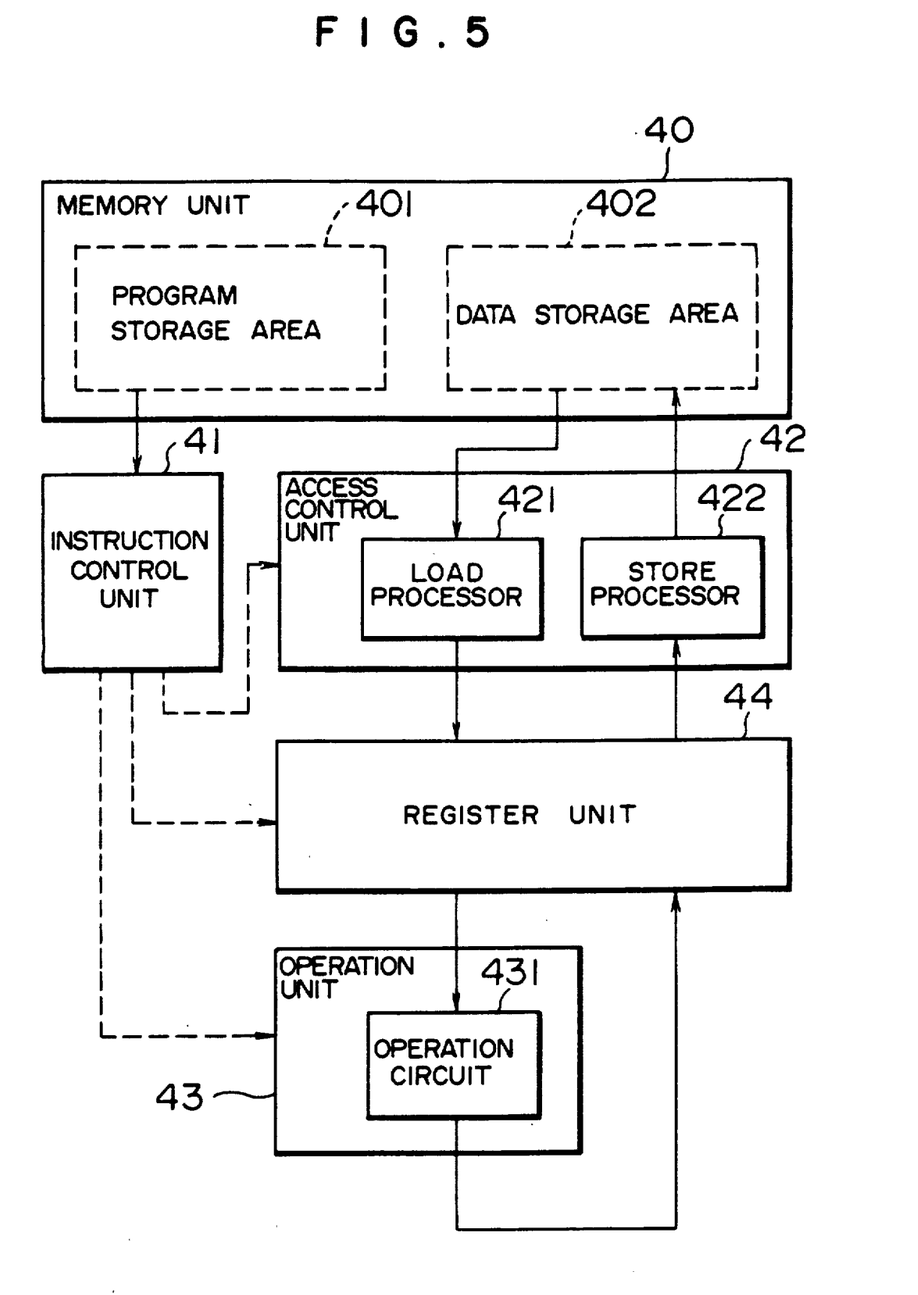
FIG. 5 shows a configuration of the embodiment.

All the logic table, event table, other fields etc. are stored in the data storage area 402 in FIG. 5.

The data necessary for the execution of the logic simulation has thus been explained.

Figure 7:
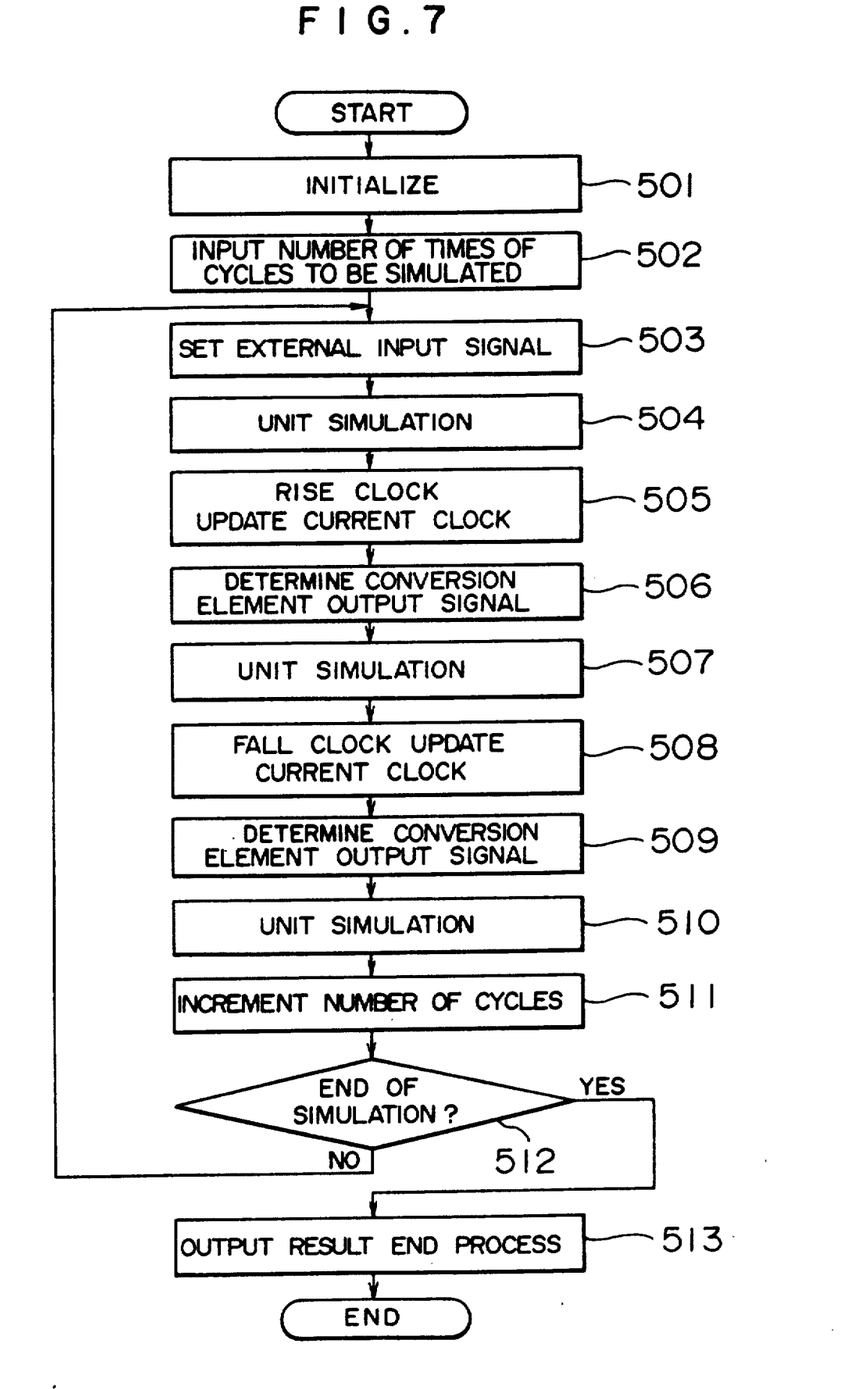
FIG. 7 shows a flow chart of the operation of the embodiment.

The operation of the logic simulation processor of the present embodiment is now explained with reference to FIG. 7 to FIGS. 9 and 7. The programs for the operation are stored in the program storage area 401 in FIG. 5 to FIG. 7.

In a step 501 the simulation execution table is developed and signal values are initialized.

In a step 502, "0" is set into the field which retains the number of simulation execution cycles.

In a step 503, the signal value externally inputted at each time is stored into the field VAL of the record of the corresponding logic table. When the signal value changes, the contents of the fields FO1 and FO2 of the record of the logic table are stored into the event table as events.

In a step 504, the event produced in the step 503 is processed. For each of the events stored in the event table, the record of the logic table is read, a new output signal value is calculated based on the type of element stored in the field FN and the input signal value, that is, the content of the field VAL of the record pointed by the field FI1 or FI2, and if it is different from the previous output signal value, that is, the content of the field VAL of the record, the content of the field VAL is updated and the newly generated event is registered, that is, the contents of the fields FO1 and FO2 of the record are stored into the event table. When the field FN represents the virtual conversion element and the input signal includes the clock signal, the pointer which points that record is stored into the conversion event table.

In a step 504, the above process is repeated until new event is no longer generated.

In a step 505, the content of the current clock is updated in response to (or synchronism with) the use of the clock signal.

In a step 506, the clock signal conversion which is unique to the present invention is carried out. For each of the pointers stored in the conversion event table, the step 504 is repeated to the record of the logic table pointed by the pointer, the content of the field VAL is updated and the newly generated event is registered. The output signal value is determined by the relation shown in FIG. 4 based on the input signal value and the content of the current clock.

In a step 507, the step 506 is repeated until no further new event is generated.

In a step 508, the content of the current clock is updated in response to (or in synchronism with) the fall of the clock signal.

Steps 509 and 510 are similar to the steps 506 and 507.

In a step 511, the number of cycles is incremented by one.

In step 512, it is determined whether the simulation is ended by comparing the incremented number of cycles with a specified number of times. The number of times is provided by an external source as a parameter at the time of start of execution of the simulation.

The steps 503 to 511 are repeated the specified number of times.

In a step 513, the simulation result is edited and outputted.

The operation of the logic simulation processor of the present embodiment has thus been explained.

In accordance with the present embodiment, by adding the virtual conversion element which is a very simple element, the clock event suppress system can be adopted except for a portion of the circuit to be simulated, and the overall simulation execution speed is increased.

While particular embodiments of the invention have been shown and described, it will be obvious to those skilled in the art that various changes and modifications may be made without departing from the present invention in its broader aspects.

We claim:

1. In a logic simulation system, a method of simulating operation of a logic circuit which includes a plurality of circuit elements, comprising the steps of:
providing a logic table which includes a plurality of records, wherein conversion elements are correspondingly associated with circuit elements of a predetermined type to convert input signal values to be inputted to a circuit element of a predetermined type by an associated conversion element into output signal values which are inputted to said circuit element of said predetermined type as said input signal values, each record corresponding to one of said plurality of circuit elements or one of said conversion elements, each record including information representing operation results of a corresponding circuit element or a corresponding conversion element and associating said each record with other records to represent in said logic table the connections of said circuit elements and said conversion elements;
simulating operation of said logic circuit by referring to said plurality of records in accordance with said connections of said circuit elements and said conversion elements; and
producing output signal values of a conversion element associated with a predetermined type of circuit element when a record being referred to corresponds to said predetermined type of circuit element and when input signal values to be inputted to said circuit element of said predetermined type are clock signals.

2. A method according to claim 1, wherein, when an input signal value inputted to said conversion element is one of a plurality of basic input signal values, an output signal value of said conversion element is said input signal value and when an input signal value inputted to said conversion element is a clock signal, an output signal value of said conversion element is determined in accordance with a current clock signal.

3. A method according to claim 2, wherein each record includes input pointers and output pointers, and said connections are represented by the input pointers and the output pointers of each record.

4. A method according to claim 2, wherein each record includes data indicating whether a circuit element corresponding to said each record is of a predetermined type, and said producing step comprises the substep of determining the predetermined type of said circuit element from said data.

5. A method according to claim 2, wherein the providing step includes the substep of:
providing an event table and a conversion event table; and
wherein said simulating step includes the substeps of
registering in said event table a pointer which points to a circuit element corresponding to a record to be referred to next as a next circuit element, when said record being referred to does not correspond to a circuit element of a predetermined type,
selecting said next circuit element in accordance with contents of said event table,
registering in said conversion event table a pointer which points to a conversion element when a record being referred to corresponds to a circuit element of a predetermined type and when an input signal of said circuit element of said predetermined type includes a clock signal, and
selecting a conversion element in accordance with contents of said conversion event table.

6. A method according to claim 5, wherein said producing step includes the step of:
referring to a conversion table to obtain operation results when said record being referred to corresponds to one of said conversion elements.

7. A method according to claim 1, wherein said simulating step is started when said input signal values are changed.

8. A simulation system for simulating operation of a logic circuit which includes a plurality of circuit elements, comprising:

memory means for storing a logic table which includes a plurality of records, wherein conversion elements are correspondingly associated with circuit elements of a predetermined type to connect input signal values to be inputted to a circuit element of a predetermined type by an associated conversion element into output signal values which are inputted to said circuit element of said predetermined type as said input signal values, each record corresponding to one of said plurality of circuit elements or one of said conversion elements, each record including information representing operation results of a corresponding circuit element or a corresponding conversion element and associating said each record with other records to represent in said logic table the connections of said circuit elements and said conversion elements; and simulation means for referring to said plurality of records in accordance with said connections for simulation of the operation of said logic circuit, said simulation means including producing means for producing output signal values of a conversion element associated with a predetermined type of circuit element when a record being referred to corresponds to said predetermined type of circuit element and when input signal values to be inputted to said circuit element of said predetermined type are clock signals.

9. A system according to claim 8, wherein, when an input signal value inputted to said conversion element is one of a plurality of basic input signal values, an output signal value of said conversion element is said input signal value and when an input signal value inputted to said conversion element is a clock signal, an output signal value of said conversion element is determined in accordance with a current clock signal.

10. A system according to claim 9, wherein each record includes input pointers and output pointers, and said connections are represented by said input pointers and said output pointers of each record.

11. A system according to claim 9, wherein each record includes data indicating whether a circuit element corresponding to said each record is of a predetermined type, and said producing means includes means for determining the predetermined type of said circuit element from said data.

12. A system according to claim 9, wherein said memory means comprises:

means for storing an event table and a conversion event table; and said simulating means includes means for registering in said event table a pointer which points to a circuit element corresponding to a record to be referred to next as a next circuit element, when said record being referred to does not correspond to a circuit element of a predetermined type and when an input signal of said circuit element does not include a clock signal, means for selecting said next circuit element in accordance with contents of said event table, means for registering in said conversion event table a pointer which points to a conversion element when a record being referred to corresponds to a circuit element of a predetermined type and when said input signal of said circuit element includes a clock signal, and means for selecting a conversion element in accordance with contents of said conversion event table.

13. A system according to claim 12, wherein said memory means further comprises:

means for storing a conversion table which represents operation results of said conversion elements; and said producing means includes:

referring means for referring to said conversion table to obtain operation results when said record being referred to corresponds to one of said conversion elements.

14. A system according to claim 8, wherein said simulating means is started when said input signal values are changed.

* * * * *